(12) United States Patent
Gao et al.

(10) Patent No.: US 10,386,695 B2
(45) Date of Patent: Aug. 20, 2019

(54) AUXILIARY PANEL AND DISPLAY DEVICE

(71) Applicant: BOE TECHNOLOGY GROUP CO., LTD., Beijing (CN)

(72) Inventors: Jian Gao, Beijing (CN); Xiaochuan Chen, Beijing (CN); Yafeng Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 15/560,624

(22) PCT Filed: Mar. 9, 2017

(86) PCT No.: PCT/CN2017/076089
§ 371 (c)(1),
(2) Date: Sep. 22, 2017

(87) PCT Pub. No.: WO2017/206564
PCT Pub. Date: Dec. 7, 2017

(65) Prior Publication Data
US 2018/0180967 A1    Jun. 28, 2018

(30) Foreign Application Priority Data
Jun. 2, 2016    (CN) .......................... 2016 1 0390794

(51) Int. Cl.
*G02F 1/1347* (2006.01)
*G02F 1/29* (2006.01)
(Continued)

(52) U.S. Cl.
CPC ............ *G02F 1/29* (2013.01); *G02F 1/13471* (2013.01); *G09F 9/33* (2013.01); *G09G 3/36* (2013.01);
(Continued)

(58) Field of Classification Search
None
See application file for complete search history.

(56) References Cited

U.S. PATENT DOCUMENTS

2016/0195646 A1    7/2016    Su et al.

FOREIGN PATENT DOCUMENTS

CN    101968587 A    2/2011
CN    201749269 U    2/2011
(Continued)

OTHER PUBLICATIONS

International Search Report for PCT Application No. PCT/CN2017076089 dated May 31, 2017.

*Primary Examiner* — Richard H Kim
(74) *Attorney, Agent, or Firm* — Calfee, Halter & Griswold LLP

(57) ABSTRACT

An auxiliary panel, includes two auxiliary liquid crystal panels provided in a stack, wherein each of the auxiliary liquid crystal panels includes a liquid crystal layer, a first substrate and a second substrate provided opposite to each other to form a cell, the liquid crystal layer is encapsulated between the first substrate and the second substrate, the first substrate includes a first base substrate and a first transparent electrode layer, the second substrate includes a second base substrate and a second transparent electrode layer comprising a plurality of second transparent electrodes arranged in a matrix, a number of the second transparent electrodes is equal to a number of the second transparent electrodes, the second transparent electrodes on one of the auxiliary liquid crystal panels and the second transparent electrodes on the other of the auxiliary liquid crystal panels have corresponding positions and the same shape.

19 Claims, 14 Drawing Sheets

(51) Int. Cl.
    *G09F 9/33*     (2006.01)
    *G09G 3/36*     (2006.01)
    *H01L 27/32*    (2006.01)
(52) U.S. Cl.
    CPC .... *H01L 27/3232* (2013.01); *G02F 2001/291* (2013.01); *G02F 2201/12* (2013.01); *G09G 2300/0426* (2013.01); *G09G 2300/0465* (2013.01)

(56) References Cited

FOREIGN PATENT DOCUMENTS

| | | |
|---|---|---|
| CN | 104464523 A | 3/2015 |
| CN | 105572930 A | 5/2016 |
| CN | 105589277 A | 5/2016 |
| CN | 105824159 A | 8/2016 |
| KR | 20130064333 A | 6/2013 |

AUXILIARY PANEL AND DISPLAY DEVICE

CROSS-REFERENCE TO RELATED APPLICATIONS

The present application is based on International Application No. PCT/CN2017/076089, filed on Mar. 9, 2017, which is based upon and claims priority to Chinese Patent Application No. 201610390794.6, titled "Auxiliary panel and display device", filed Jun. 2, 2016, the entire contents of which are incorporated herein by reference.

TECHNICAL FIELD

The present disclosure relates to the field of curved display technology, and more particularly, to an auxiliary panel and a display device.

BACKGROUND

Existing display devices may be divided into flat display devices and curved display devices. Flat display devices may save physical space, but have undesirable light distribution properties. When a flat display device is placed right before human eyes, with the viewing distance to either side increases, light intensity may be gradually decreased, resulting in an undesirable experience for the viewing angles of the human eyes. Especially for a la flat display device with large size, this effect is more significant. A curved display device has a curved display surface. Therefore, it may mitigate the above effect. However, the curved display device may have defects such as a large size and being difficult to be installed.

Therefore, how to realize a curved display without increasing the installation size of the display device becomes a technical problem that needs to be solved in the art.

SUMMARY

The present disclosure is to provide an auxiliary panel and a display device.

As one aspect of the present disclosure, there is provided an auxiliary panel, comprising two auxiliary liquid crystal panels provided in a stack, wherein each of the auxiliary liquid crystal panels comprises a liquid crystal layer, a first substrate and a second substrate provided opposite to each other to form a cell, the liquid crystal layer is encapsulated between the first substrate and the second substrate, the first substrate comprises a first base substrate and a first transparent electrode layer disposed on the first base substrate, the second substrate comprises a second base substrate and a second transparent electrode layer disposed on the second base substrate, the second transparent electrode layer comprises a plurality of second transparent electrodes arranged in a matrix, a number of the second transparent electrodes on one of the auxiliary liquid crystal panels is equal to a number of the second transparent electrodes on the other of the auxiliary liquid crystal panels, the second transparent electrodes on one of the auxiliary liquid crystal panels and the second transparent electrodes on the other of the auxiliary liquid crystal panels have corresponding positions, a second transparent electrode on one of the auxiliary liquid crystal panels has the same shape as the corresponding second transparent electrode on the other of the auxiliary liquid crystal panels, and is rotated by 90° with respect to the corresponding second transparent electrode on the other of the auxiliary liquid crystal panels, and initial arrangement directions of the liquid crystal layers in the two auxiliary liquid crystal panels are the same.

In an embodiment, the first transparent electrode layer of each of the auxiliary panels includes a planar electrode covering the first base substrate, the second transparent electrodes of each of the auxiliary liquid crystal panels are block electrodes, and the second transparent electrode layer of each of the auxiliary liquid crystal panels is an array comprising a plurality of the second transparent electrodes.

In an embodiment, the second base substrate of one of the auxiliary liquid crystal panels is the same transparent base substrate as the first base substrate of the other of the auxiliary liquid crystal panels.

As another aspect of the present disclosure, there is provided a display device comprising a display panel, wherein the display panel further comprises an auxiliary panel and a control module, the auxiliary panel being the above auxiliary panel provided by the present disclosure, the auxiliary panel is provided at the light exit side of the display panel, and the controller is capable of providing a control signal to the first transparent electrode layer and the second transparent electrode layer of the two auxiliary liquid crystal panels, respectively, such that light transmitted by the display panel forms an image on a curved surface and the opening of the curved surface faces the light exit direction of the display device.

In an embodiment, when the controller does not supply a control signal to the first transparent electrode layer and the second transparent electrode layer of each of the two auxiliary liquid crystal panels, the refractive indices of all portions of each of the two auxiliary liquid crystal panels are the same.

In an embodiment, the display panel comprises a plurality of pixel units arranged in an array, each pixel unit comprises a plurality of sub-pixel units, of the two auxiliary liquid crystal panels, a width direction of the second transparent electrode of one of the auxiliary liquid crystal panels is coincident with a width direction of the display panel, and the controller is configured to be capable of providing a control signal to the first transparent electrode layer and the second transparent electrode layer of each of the auxiliary liquid crystal panels, to cause the refractive indices of the liquid crystal material corresponding to the second transparent electrodes in the auxiliary liquid crystal panels gradually increase from either side in the width direction of the second transparent electrode to the middle of the second transparent electrode, to obtain an equivalent positive cylindrical lens, such that in the two auxiliary liquid crystal panels, the equivalent positive cylindrical lenses obtained by a pair of second transparent electrodes corresponding to each other have their meridian directions orthogonal to each other, to obtain an equivalent positive spherical lens and the focal length of the equivalent positive spherical lens formed gradually decreases from either side of the width direction of the display panel to the middle of the width direction of the display panel.

In an embodiment, the controller is configured to provide a control signal to cause the focal length of the equivalent positive spherical lens formed in the liquid crystal layer of the auxiliary panel to be larger than a distance between the auxiliary panel and the display panel.

In an embodiment, each of the pixel units corresponds to a pair of second transparent electrodes corresponding to each other, and an aperture ratio of the display panel gradually increases from the middle of the width direction of the display panel to either side of the width direction of the display panel.

In an embodiment, the controller is configured to provide a control signal to cause the focal length of the equivalent positive spherical lens formed in the liquid crystal layer of the auxiliary panel to be smaller than a distance between the auxiliary panel and the display panel.

In an embodiment, each of the pixel units corresponds to a pair of second transparent electrodes corresponding to each other, and an aperture ratio of the display panel gradually decreases from the middle of the width direction of the display panel to either side of the width direction of the display panel.

In an embodiment, each of the sub-pixels corresponds to a pair of second transparent electrodes corresponding to each other, and the controller is configured to provide a control signal to the first transparent electrode layer and each of the second transparent electrodes, to cause the focal lengths of the equivalent positive spherical lenses corresponding to the different sub-pixels in the same pixel unit are the same and the values of the focal lengths of the plurality of said equivalent positive spherical lenses corresponding to the auxiliary panel are distributed symmetrically with respect to a central line of the width direction of the display panel.

In an embodiment, each of the sub-pixels corresponds to a plurality of pairs of second transparent electrodes corresponding to each other, and the controller is configured to provide a control signal to the first transparent electrode layer and each of the second transparent electrodes, to cause the focal lengths of the equivalent positive spherical lenses corresponding to different sub-pixels in the same pixel unit to be the same and the values of the focal lengths of the plurality of said equivalent positive spherical lenses corresponding to the auxiliary panel are symmetrically distributed with respect to a central line of the width direction of the display panel.

In an embodiment, the auxiliary panel is divided into three portions in the width direction, and the control signal provided by the controller is to cause the focal lengths of the equivalent positive spherical lens corresponding to the portions of the liquid crystal layer on either side of the auxiliary panel to be smaller than the distance between the auxiliary panel and the display panel, and cause the focal lengths of the equivalent positive spherical lens corresponding to the portions of the liquid crystal layer in the middle of the auxiliary panel to be larger than the distance between the auxiliary panel and the display panel.

In an embodiment, for the portions of the display panel corresponding to the portions at either side of the auxiliary panel, the aperture ratio of the display panel gradually decreases from the middle of the width direction of the display panel to either side in the width direction of the display panel, and for the portions of the display panel corresponding to the portions in the middle of the auxiliary panel, the aperture ratio of the display panel gradually increases from the middle of the width direction of the display panel to either side in the width direction of the display panel.

In an embodiment, each of the sub-pixels corresponds to a pair of second transparent electrodes corresponding to each other, and the focal lengths of the equivalent positive spherical lenses corresponding to different sub-pixels in the same pixel unit are the same.

In an embodiment, of the two auxiliary liquid crystal panels, the width direction of the second transparent electrode of one of the auxiliary liquid crystal panels is consistent with the width direction of the display panel, and the controller is configured to provide a control signal to the first transparent electrode layer and the second transparent electrode layer of the each of the auxiliary liquid crystal panels, to cause the refractive indices of the liquid crystal material corresponding to the respective second transparent electrodes in each of the auxiliary liquid crystal panels to gradually decrease from either side in the width direction of the second transparent electrode to the middle of the second transparent electrode, and in the auxiliary liquid crystal panels, to obtain an equivalent negative cylindrical lens, the equivalent negative lenses obtained by two second transparent electrodes corresponding to each other have their meridian directions orthogonal to each other, to obtain an equivalent negative spherical lens, and the focal length of the equivalent negative spherical lens formed gradually increases from either side in the width direction of the display panel to the middle in the width direction of the display panel.

In an embodiment, of the two auxiliary liquid crystal panels, the width direction of the second transparent electrode of one of the auxiliary liquid crystal panels is consistent with the width direction of the display panel, the auxiliary panel is divided into three portions in the width direction, and the controller is configured to provide a control signal to the first transparent electrode layer and the second transparent electrodes, to cause the refractive indices of the portions in the liquid crystal layer at either side of the auxiliary panel corresponding to the respective second transparent electrodes to gradually decrease from either side in the width direction of the second transparent electrode to the middle of the second transparent electrode, and to cause the refractive indices of the portions in the liquid crystal layer in the middle of the auxiliary panel corresponding to the respective second transparent electrodes to gradually increase from either side in the width direction of the second transparent electrode to the middle of the second transparent electrode.

In an embodiment, of the two auxiliary liquid crystal panels, the width direction of the second transparent electrode of one of the auxiliary liquid crystal panels is consistent with the width direction of the display panel, the auxiliary panel is divided into three portions in the width direction, and the controller is configured to provide a control signal to the first transparent electrode layer and the second transparent electrodes, to cause the refractive indices of the portions in the liquid crystal layer at either side of the auxiliary panel corresponding to the respective second transparent electrodes to gradually increase from either side in the width direction of the second transparent electrode to the middle of the second transparent electrode, and to cause the refractive indices of the portions in the liquid crystal layer in the middle of the auxiliary panel corresponding to the respective second transparent electrodes to gradually decrease from either side in the width direction of the second transparent electrode to the middle of the second transparent electrode.

In an embodiment, the display panel is a liquid crystal display panel, and the display panel further comprises a first polarizer disposed on the light entrance side of the display panel and a second polarizer disposed on the light exit side of the display panel.

In an embodiment, the display panel is an organic light emitting diode display panel, the display device further comprises two auxiliary panels arranged in a stack, initial arrangement directions of the liquid crystal layers of the two auxiliary panels are perpendicular to each other, and the controller is configured to simultaneously prove the same control signal to the two auxiliary panels.

BRIEF DESCRIPTION OF THE DRAWINGS

The accompanying drawings are intended to provide a further understanding of the present disclosure and constitute a part of the specification, together with the following detailed description, for purposes of this disclosure, but are not to be construed as limiting the scope of the disclosure. In the drawings:

FIG. 8b is a top view of FIG. 8a;

FIG. 9a is a schematic diagram of another auxiliary liquid crystal panel forming an equivalent positive lens, with the meridian direction of the equivalent positive lens of FIG. 9a being orthogonal to the meridian direction of the equivalent positive lens formed in FIG. 8a;

FIG. 9b is a top view of FIG. 9a;

FIG. 10b is a top view of FIG. 10a;

FIG. 11a is a schematic diagram of another auxiliary liquid crystal panel forming an equivalent negative lens, with the meridian direction of the equivalent positive lens of FIG. 11a being orthogonal to the meridian direction of the equivalent positive lens formed in FIG. 10a;

FIG. 11b is a top view of FIG. 10a;

DETAILED DESCRIPTION

Hereinafter, specific embodiments of the present disclosure will be described in detail with reference to the accompanying drawings. It is to be understood that the specific embodiments described herein are for the purpose of illustration and explanation only and are not intended to limit the present disclosure.

Figure 1:
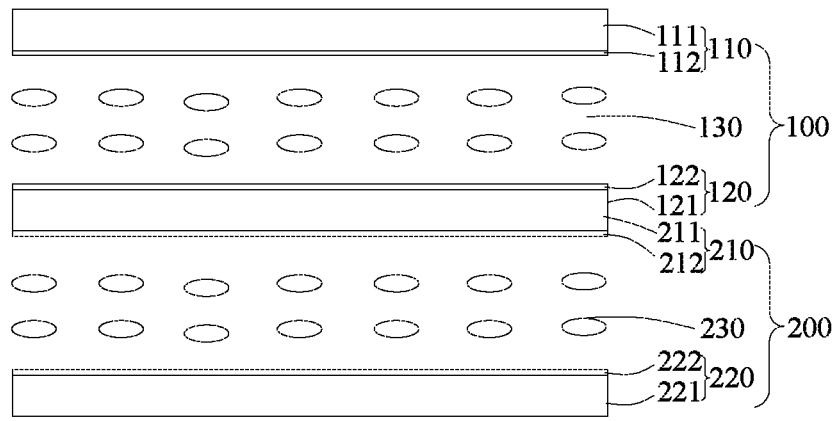
FIG. 1 is a schematic diagram of an auxiliary panel provided by the present disclosure.

As an aspect of the present disclosure, there is provided an auxiliary panel. As shown in FIG. 1, the auxiliary panel includes two auxiliary liquid crystal panels (an auxiliary liquid crystal panel 100 and an auxiliary liquid crystal panel 200 in FIG. 1) provided in a stack. Each of the auxiliary liquid crystal panels includes a liquid crystal layer, and a first substrate and a second substrate provided opposite to each other to form a cell. The liquid crystal layer is encapsulated between the first substrate and the second substrate. The first substrate includes a first base substrate and a first transparent electrode layer disposed on the first base substrate. The second substrate includes a second base substrate and a second transparent electrode layer disposed on the second base substrate. The second transparent electrode layer includes a plurality of second transparent electrodes arranged in a matrix. The number of the second transparent electrodes on one of the auxiliary liquid crystal panels is equal to the number of the second transparent electrodes on the other of the auxiliary liquid crystal panels, and the second transparent electrodes on one of the auxiliary liquid crystal panels are corresponded with the second transparent electrodes on the other of the auxiliary liquid crystal panels in positions. A second transparent electrode on one of the auxiliary liquid crystal panels has the same shape as the corresponding second transparent electrode on the other of the auxiliary liquid crystal panels, and is rotated by 90° with respect to the corresponding second transparent electrode on the other of the auxiliary liquid crystal panels. The initial arrangement directions of the liquid crystal layers in the two auxiliary liquid crystal panels are the same.

In an implementation as shown in FIG. 1, the auxiliary panel includes an auxiliary liquid crystal panel 100 and an auxiliary liquid crystal panel 200.

The auxiliary liquid crystal panel 100 includes a first substrate 110, a second substrate 120, and a liquid crystal layer 130 encapsulated between the first substrate 110 and the second substrate 120. The first substrate 110 includes a first base substrate 111 and a first transparent electrode layer 112. The second substrate 120 includes a second base substrate 121 and a second transparent electrode layer 122. The second transparent electrode layer 122 includes a plurality of second transparent electrodes. When the auxiliary liquid crystal panel 100 is used in a display device, a control signal is applied to the first transparent electrode layer 112 and the second transparent electrode layer 122 by a control module, to cause the portions in the liquid crystal layer 130 which are corresponded to the respective second transparent electrodes to form a cylindrical lens.

The auxiliary liquid crystal panel 200 includes a first substrate 210, a second substrate 220, and a liquid crystal layer 230 encapsulated between the first substrate 210 and the second substrate 220. The first substrate 210 includes a first base substrate 211 and a first transparent electrode layer 212. The second substrate 220 includes a second base substrate 221 and a second transparent electrode layer 222. The second transparent electrode layer 222 includes a plurality of second transparent electrodes. A second transparent electrode on the auxiliary liquid crystal panel 100 has the same shape as the corresponding second transparent electrode on the auxiliary liquid crystal panel 200 and rotates by 90° with respect to the corresponding second transparent electrode on the auxiliary liquid crystal panel 200. When the auxiliary liquid crystal panel 200 is used in a display device, a control signal is applied to the first transparent electrode layer and the second transparent electrode layer by the controller such that the portions in the liquid crystal layer 230 which are corresponded to the respective second transparent electrodes form a cylindrical lens.

Figure 3:
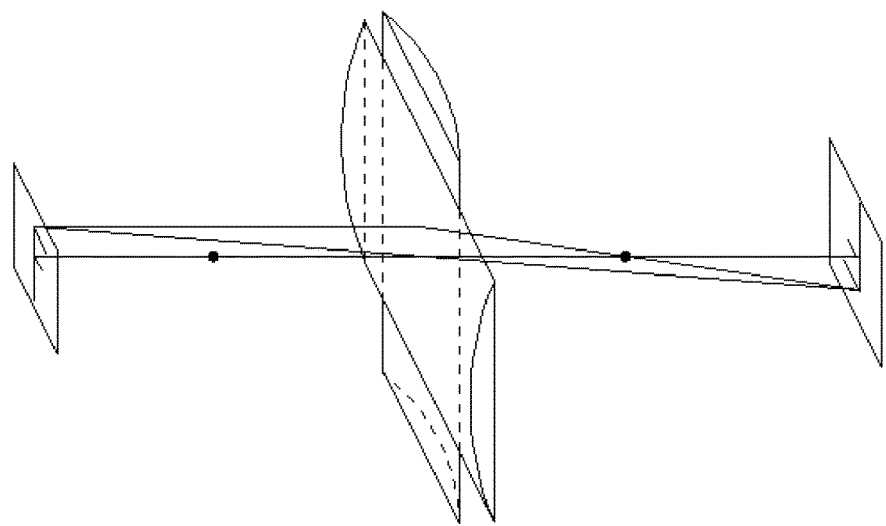
FIG. 3 is a schematic diagram of forming an image by an orthogonal cylindrical lens.

It is to be noted that in the present disclosure, the signals applied to the auxiliary liquid crystal panel 100 and the auxiliary liquid crystal panel 200 by the controller are different, such that the meridian direction of the equivalent cylindrical lens formed in the auxiliary liquid crystal panel 100 is orthogonal to the meridian direction of equivalent lens formed in the auxiliary liquid crystal panel 200. It is to be noted that the equivalent lens formed in the auxiliary liquid crystal panel 100 and the equivalent lens formed in the auxiliary equivalent lens 200 have the same parameters (including the focal lengths and sizes) except for the meridian direction. As shown in FIG. 3, the two equivalent cylindrical lenses are orthogonal to each other and form an equivalent spherical lens.

The operation principle of the auxiliary panel provided by the present disclosure will be described in detail hereinafter, and will not be described here in detail.

In order to facilitate manufacture, in one embodiment, the first transparent electrode layer of each of the auxiliary panels includes a planar electrode covering the first base substrate.

In one embodiment, the second transparent electrodes on the auxiliary liquid crystal panel are arranged in an array. The second transparent electrodes are block electrodes, and the second transparent electrode layer of each of the auxiliary liquid crystal panels is an array including a plurality of the second transparent electrodes.

In order to reduce the overall thickness of the auxiliary panel and to reduce the deviation between the focal points of the equivalent cylindrical lens formed by the two auxiliary liquid crystal panels, in one embodiment, the second base substrate of one of the auxiliary liquid crystal panels and the first base substrate of the other of the auxiliary liquid crystal panels are the same transparent base substrate. As shown in FIG. 1, the second base substrate 121 of the auxiliary liquid crystal panel 100 is the same transparent substrate as the first base substrate 211 of the auxiliary liquid crystal panel 200.

Figure 2:
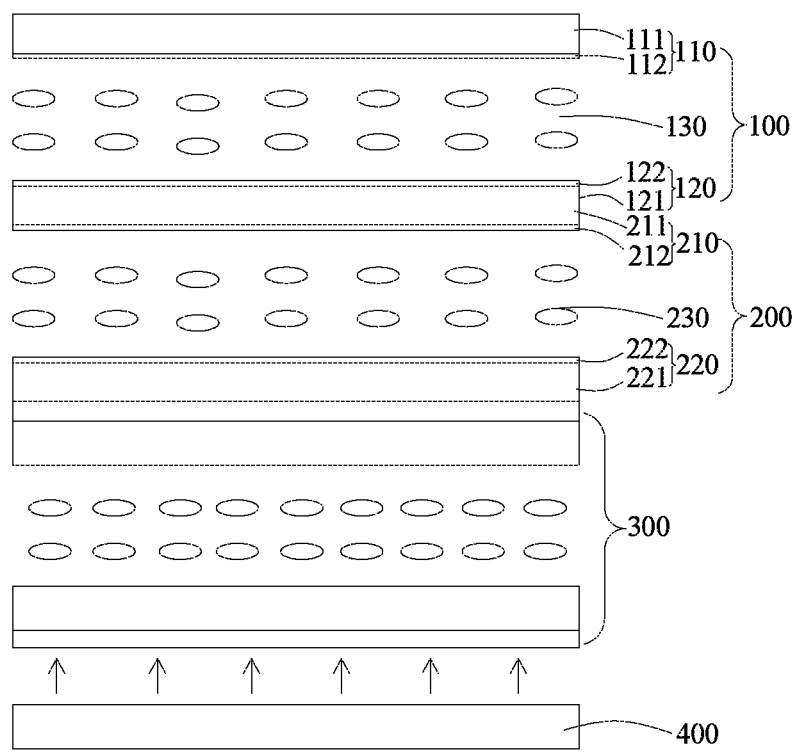
FIG. 2 is a structural schematic diagram of a display device provided by the present disclosure, and the display panel being a liquid crystal display panel.

As a further aspect of the present disclosure, there is provided a display device. As shown in FIG. 2, the display device includes a display panel 300. The display device further includes the above auxiliary panel and the controller provided by the present disclosure (not shown). The auxiliary panel is provided at the light exit side of the display panel. The controller is capable of providing a control signal to the first transparent electrode layer and the second transparent electrode layer of the two auxiliary panels, respectively, such that light transmitted by the display panel forms an image on the curved surface and the opening of the curved surface is toward the light exit direction of the display device.

When the display device provided by the present disclosure performs display, a gray-scale signal is provided to the display panel 300 to cause the display panel 300 to display an image.

The deflection of the liquid crystal molecules in the liquid crystal layer 130 and the liquid crystal layer 230 may be controlled by applying signals to the auxiliary liquid crystal panel 100 and the auxiliary liquid crystal panel 200 by the controller so as to respectively form an equivalent cylindrical lens in the liquid crystal layer 130 and the liquid crystal layer 230.

Figure 4:
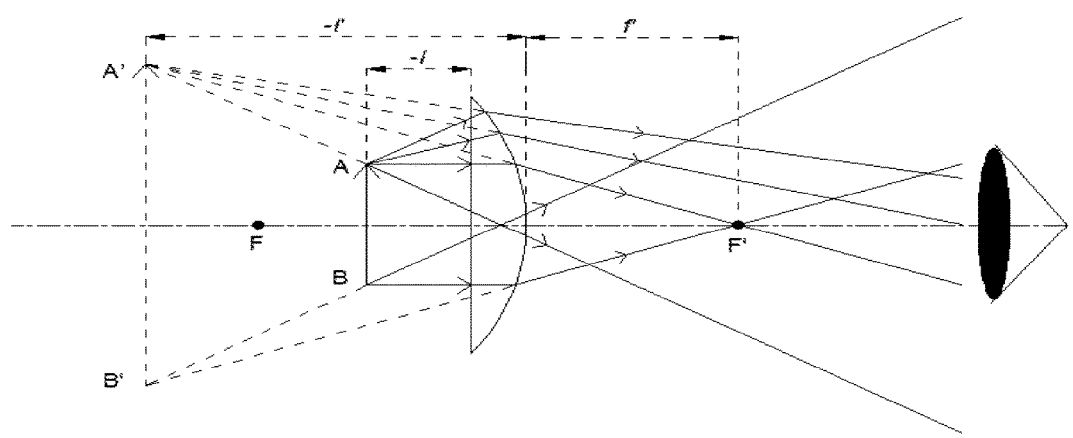
FIG. 4 is a diagram illustrating principle of forming an enlarged virtual image by a positive lens.
Figure 5:
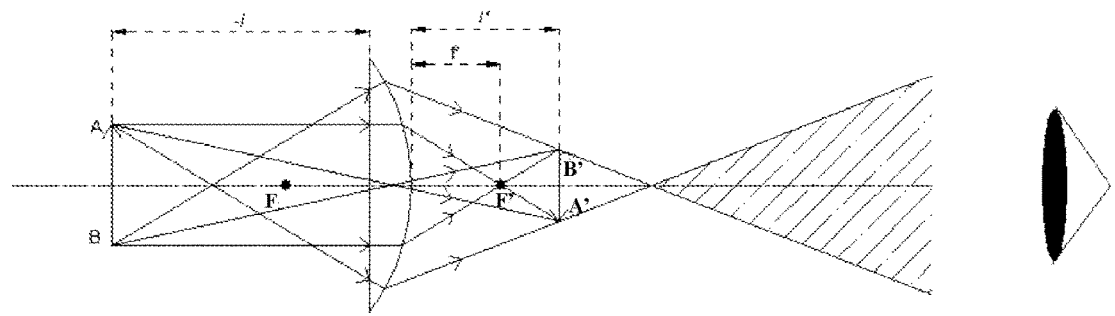
FIG. 5 is a schematic diagram of forming a reduced and inverted real image by a positive lens.

FIGS. 4 and 5 illustrate principle of forming an image by light transmitted through a positive lens.

FIG. 4 is a diagram illustrating principle of forming a virtual image by a positive lens. As shown in the figure, an object AB is placed behind the lens (the left side in the figure), such that the object distance l is smaller than the focal length f of the lens. Then, a virtual image A'B' may be formed behind the lens (the left side in the figure) for the object AB, and captured by human eyes.

FIG. 5 is a diagram illustrating principle of forming a real image by a positive lens. As shown in the figure, an object AB is placed behind the lens (the left side in the figure), such that the object distance l is larger than the focal length f of the lens. Then, an inverted image B'A' may be formed in front of the lens (the right side in the figure) for the object AB.

FIG. 4 is a diagram illustrating principle of forming an image by a negative lens. An object AB is placed behind the lens. Then, an image A'B' may be formed between the object AB and the lens.

Figure 6:
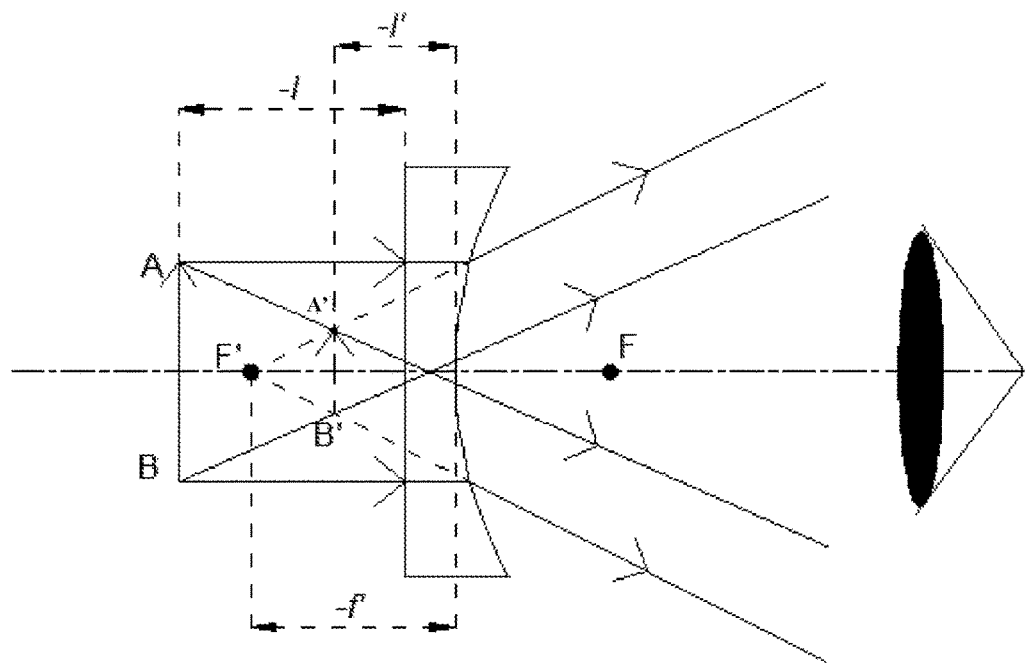
FIG. 6 is a schematic diagram of forming a reduced virtual image by a negative lens.

In FIGS. 4 to 6, F denotes a focus of the lens at the object side, and F' denotes a focus of the lens at the image side.

A formula (1) represents a relationship between the object and the image for the lens. It may be seen from the formula (1) that, when the focal length f of the lens and a distance l between the object and the lens are determined, the distance l' between the object image and the lens may be obtained $$\frac{1}{l'} - \frac{1}{l} = \frac{1}{f'} \tag{1}$$

where, l denotes a distance between the object and the lens;

l' denotes a distance between the object image and the lens; and f denotes a focal length of the lens.

In the display device provided by the present disclosure, the image displayed on the display panel 300 is the "object" described above. A plurality of equivalent lenses may be formed by the auxiliary liquid crystal panel 100 the auxiliary liquid crystal panel 200. Specifically, each second transparent electrode on the auxiliary liquid crystal panel 100 corresponds to one equivalent cylindrical lens, and each second transparent electrode on the auxiliary liquid crystal panel 200 corresponds to one equivalent cylindrical lens.

The distance between the display panel 300 and the auxiliary liquid crystal panel 100 is invariable. That is, l is constant in the formula (1). When designing the display device, the designer may determine the distance between the light exit surface and the image generated by each equivalent lens formed by the second transparent electrodes, as long as it may ensure that all of the equivalent lenses formed by the second transparent electrodes form images on the same curved surface. Accordingly, it may be deemed that the distance l' between the object image and the equivalent lens is known, and the focal length f' of each of the equivalent lenses formed by the auxiliary liquid crystal panel 100 may be resolved with the formula (1).

Similarly, the distance between the display panel 300 and the auxiliary liquid crystal panel 200 is invariable. That is, l is constant in the formula (1). When designing the display device, the designer may determine the distance between the light exit surface and the image generated by each equivalent lens formed by the second transparent electrodes, as long as it may ensure that all of the equivalent lenses formed by the second transparent electrodes form images on the same curved surface. Accordingly, it may be deemed that the distance l' between the object image and the equivalent lens is known, and the focal length f' of each of the equivalent lenses formed by the auxiliary liquid crystal panel 200 may be resolved with the formula (1).

Figure 7:
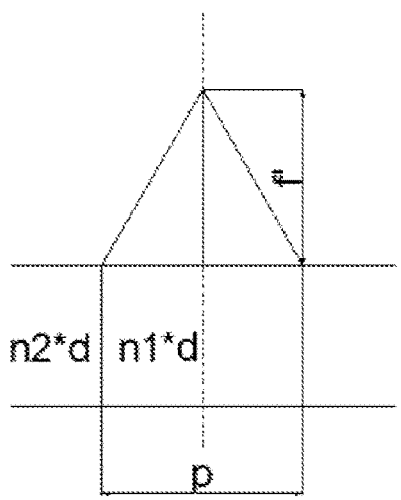
FIG. 7 illustrates an equivalent optical path diagram.

FIG. 7 is an equivalent optical path diagram of an equivalent convex lens formed in any one of the auxiliary liquid crystal panel. According to the principle of the optical path principle formula (2), refractive indices of respective parts of the equivalent lens may be obtained. Therefore, it only requires the controller to apply a signal to the first transparent electrode layer and the second transparent electrode, to cause the liquid crystals corresponding to the second transparent electrode strip to have respective refractive indices.

$$n_1 d + f' = n_2 d + \sqrt{f'^2 + (p/2)^2} \quad (2)$$

where, f denotes a focal length of the equivalent lens;

$n_1$ denotes a refractive index at the central part of the equivalent lens;

$n_2$ denotes a refractive index at an edge of the equivalent lens;

d denotes a distance between the display panel and the auxiliary panel; and p denotes a diameter of the formed equivalent lens.

Since $[(n_1-n_2)*d]^2 \approx 0$, the above formula (2) may be reduced to the following formula (3):

$$f' = \frac{p^2}{8(n_1 - n_2)d} \quad (3)$$

Where, $n_o \le n_2 \le n_1 \le n_e$. $n_o$ denotes a refractive index of light o for the liquid crystal having double refractive indices. $n_e$ denotes a refractive index of light e for the liquid crystal having double refractive indices.

The principle of calculating the focal length of the concave lens with the equivalent path principle is similar to that of the convex lens, which will not be repeated herein.

Figure 16:
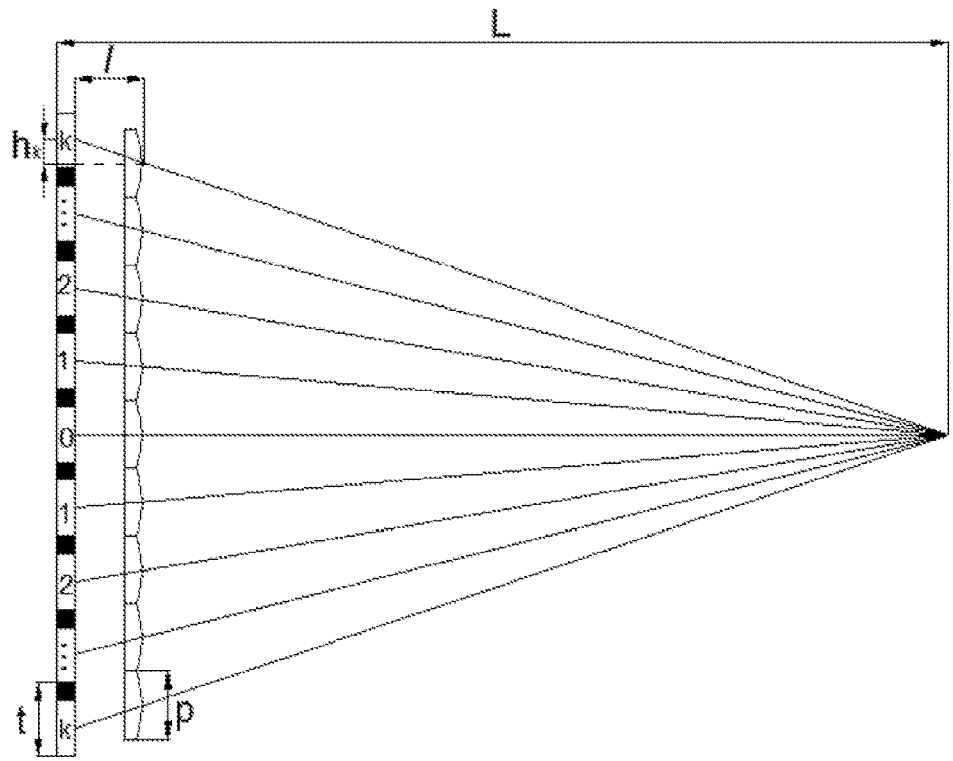
FIG. 16 is a schematic diagram illustrating a deviation between the center of the sub-pixel and the central axis of the equivalent spherical lens.
Figure 17:
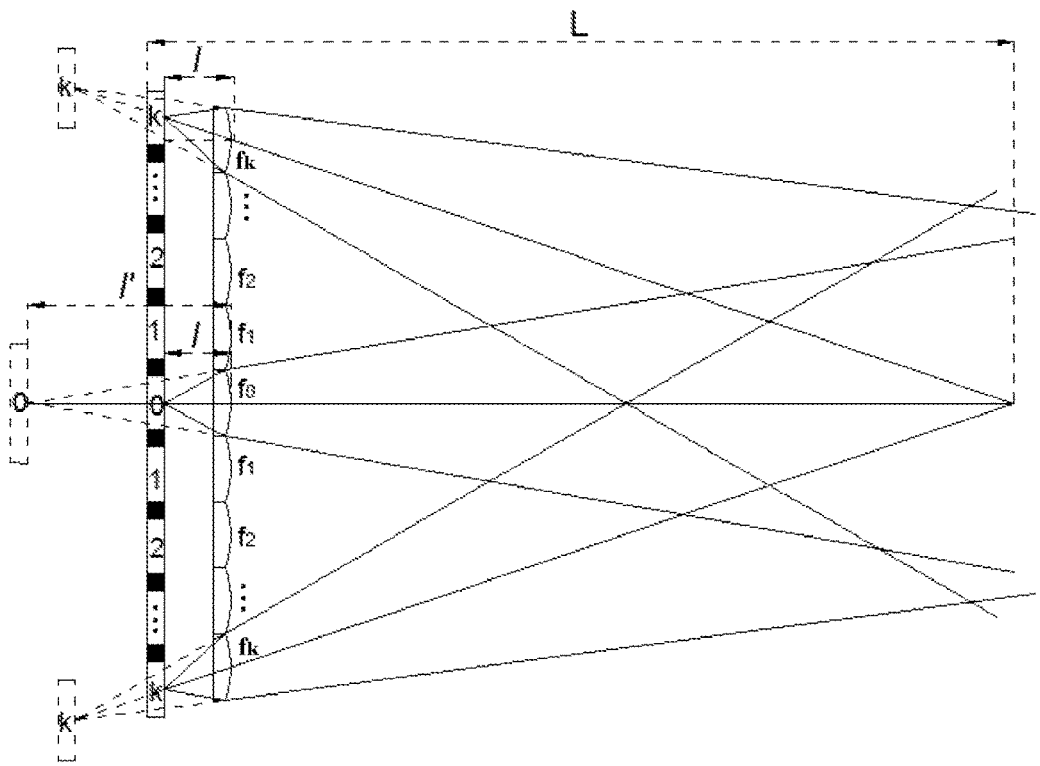
FIG. 17 is a schematic diagram illustrating a deviation between the center of the sub-pixel and the central axis of the equivalent spherical lens, with the formed image being located behind the display panel.

The following describes how to determine the diameter p of the equivalent spherical lens in conjunction with FIGS. 16 and 17.

As shown in FIGS. 16 and 17, when the human eye is at the optimum viewing distance L, the image on the entire curved surface displayed by the display device may be viewed. The following shows how to define the diameter p of the equivalent spherical lens and the deviation of and the center axis of the equivalent spherical lens from the center point of each corresponding pixel in conjunction with the optimum viewing distance L, the width t and the number of the sub-pixel.

The equivalent positive spherical lens corresponding to the sub-pixel on the uppermost edge in the width direction of the display panel is taken as an example. According to the geometric relation:

$$\frac{h_k}{l} = \frac{kt}{L} \quad (4)$$

Where, $h_k$ is the deviation of the center axis of the equivalent positive spherical lens corresponding to the sub-pixel on the uppermost edge in the width direction of the display panel and the center point of each corresponding pixel;

k is an index of a sub-pixel on the uppermost edge in an order from the middle of the width direction of the display panel to either side in the width direction of the display panel;

l is the distance between the display panel and the auxiliary panel;

t is the width of the sub-pixel;

L is the optimum viewing distance of the display device.

Therefore, the following formula (4) may be obtained:

$$h_k = \frac{ktl}{L} \quad (5)$$

Since $$kt - kp = h_k \quad (6)$$

Where, p is the diameter of the equivalent positive spherical lens.

Therefore, $$p = t \cdot \left(1 - \frac{l}{L}\right) \quad (7)$$

If one sub-pixel corresponds to n equivalent spherical lens, then $$h_{k,m} = \frac{mktl}{nL}, m \in (1, 2, 3 \ldots n)$$

-continued $$p = \frac{t}{n} \cdot \left(1 - \frac{l}{L}\right)$$

In the present disclosure, by controlling the refractive indices of the different regions of the liquid crystal layer 130 of the auxiliary liquid crystal panel 100 and the refractive indices of the different regions of the liquid crystal layer 230 of the auxiliary liquid crystal panel 200, it is possible to change the light exit direction of the light emitted from the display device and to form an image on the curved surface. That is, the display device may realize a curved display in which the viewer may stand in front of the display device to view the image displayed on the curved surface.

In the present disclosure, the display surface of the display device is not provided as a curved surface. Therefore, the installation space of the display device does not increase. That is, the display device may be installed in a smaller space.

In one embodiment, when the controller does not provide a control signal to the first transparent electrode layer 112 and the second transparent electrode layer 122 of the auxiliary liquid crystal panel 100 and does not provide a control signal to the first transparent electrode layer 212 and the second transparent electrode layer 222 of the auxiliary liquid crystal panel 200, the refractive indices of all the portions of the liquid crystal layers of each of the two auxiliary liquid crystal panels are equal. Specifically, all the portions of the refractive indices of the liquid crystal layer 130 of the auxiliary liquid crystal panel 100 are equal, and all the portions of the refractive indices of the liquid crystal layer 230 of the auxiliary liquid crystal panel 200 are equal. Therefore, the light emitted from the display panel 300 may pass through the auxiliary panel, and the viewer may see the image on the plat surface at the light exit side of the display panel.

When the viewer wants to view the image displayed on the curved surface, the controller may apply a control signal to the first transparent electrode layer and the second transparent electrode layer of the auxiliary liquid crystal panels of the auxiliary panel by the controller to form a plurality of equivalent spherical lens.

In the present disclosure, the type of the equivalent spherical lens formed on the auxiliary panel is not particularly limited. For example, a plurality of equivalent positive spherical lenses may be formed by utilizing the auxiliary panel, and a plurality of equivalent negative spherical lenses may be formed by utilizing the auxiliary panel.

According to a preferred implementation of the present disclosure, of the two auxiliary liquid crystal panels, the width direction of the second transparent electrode of one of the auxiliary liquid crystal panels is coincident with the width direction of the display panel. In a specific implementation provided by the present disclosure, in the auxiliary liquid crystal panel 100, the width direction of the second transparent electrode is coincident with the width direction of the auxiliary display panel 100. The width direction of the second transparent electrode of the second auxiliary liquid crystal panel 200 is perpendicular to the width direction of the second transparent electrode of the first auxiliary liquid crystal panel 100. It is to be noted that the width direction of the auxiliary display panel 200 here refers to the left and right direction of the viewer with respect to the front of the display surface when the display panel is in the operating state and the display surface is vertically arranged.

In one embodiment, the controller is configured to be capable of providing a control signal to the first transparent electrode layer 112 and the second transparent electrode layer 122 of the auxiliary liquid crystal panel 100, and the first transparent electrode layer 212 and the second transparent electrode layer 222 of the auxiliary liquid crystal panel 200, respectively, to cause the refractive indices of the liquid crystal material corresponding to the second transparent electrodes in the auxiliary liquid crystal panels gradually increase from either side in the width direction of the second transparent electrode to the middle of the second transparent electrode, to obtain an equivalent positive cylindrical lens. It will be readily understood that in the two auxiliary liquid crystal panels, the second transparent electrode in the auxiliary liquid crystal panel 100 and the corresponding second transparent electrode in the auxiliary liquid crystal panel 200 which has the same shape as the second transparent electrode in the auxiliary liquid crystal panel 100 and rotates by 90° with respect to second transparent electrode in the auxiliary liquid crystal panel 100 are a pair of second transparent electrodes corresponding to each other. The meridian directions of the equivalent positive cylindrical lenses obtained by the pair of second transparent electrodes corresponding to each other are orthogonal to obtain an equivalent positive spherical lens. Moreover, the focal length of the equivalent spherical lens formed gradually decrease from either side of the width direction of the display panel to the middle of the width direction of the display panel. It should be explained that a pair of transparent electrodes includes two second transparent electrodes, one of them being on the auxiliary liquid crystal panel 100 and the other on the auxiliary liquid crystal panel 200, and the positive projection of the second transparent electrode of the auxiliary liquid crystal panel 200 on the auxiliary liquid crystal panel 100 has a central point overlapped with the central point of the corresponding second transparent electrode.

Next, a schematic diagram of obtaining an equivalent spherical lens by utilizing the auxiliary panel will be described with reference to an example of a pair of second transparent electrodes corresponding to each other of the auxiliary liquid crystal panel 100 and the auxiliary liquid crystal panel 200.

Figure 8A:
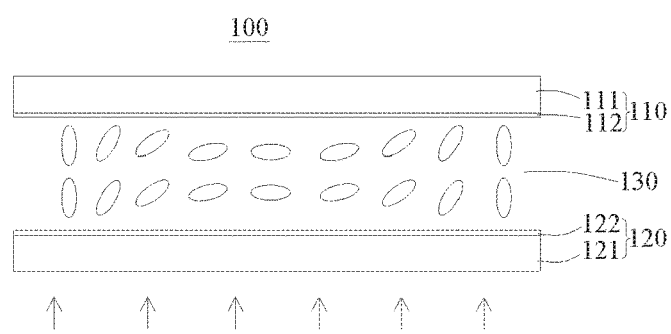
FIG. 8a is a schematic diagram of an auxiliary liquid crystal panel forming an equivalent positive lens.
Figure 8B:
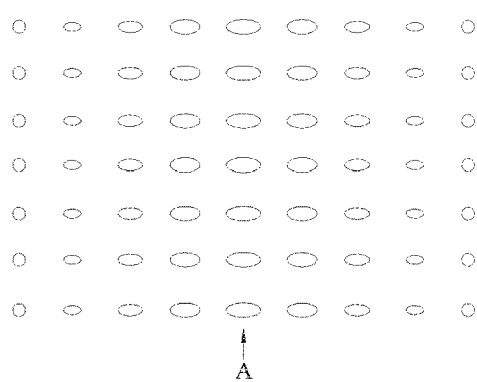

As shown in FIGS. 1 and 2, in the initial state in which the control signal is not applied, the initial arrangement state of the liquid crystal layer 130 of the liquid crystal panel 100 under irradiation is the major axis being in the horizontal direction, and the initial arrangement state of the liquid crystal layer 230 of the liquid crystal panel 200 is the major axis being in the horizontal direction As shown in FIG. 8a, the controller applies a control signal to the second transparent electrode and the first transparent electrode layer of the auxiliary liquid crystal panel 100, to cause an electric field to be formed between the second transparent electrode and the first transparent electrode layer. The liquid crystal molecules in the electric field are rotated as shown in FIGS. 8a and 8b. That is, the horizontal axis direction of the liquid crystal molecules in the middle is constant, and the degree of rotation gradually increases from the middle to either side, such that the refractive index of the liquid crystal material corresponding to each second transparent electrode gradually increases from either side in the width direction of the second transparent electrode to the middle of the second transparent electrode. Thus, FIGS. 8a and 8b illustrate a schematic diagram of forming an equivalent positive cylindrical lens by utilizing the auxiliary liquid crystal panel 100. It is to be noted that FIG. 8a is a view from the direction of A in FIG. 8b.

Figure 9A:
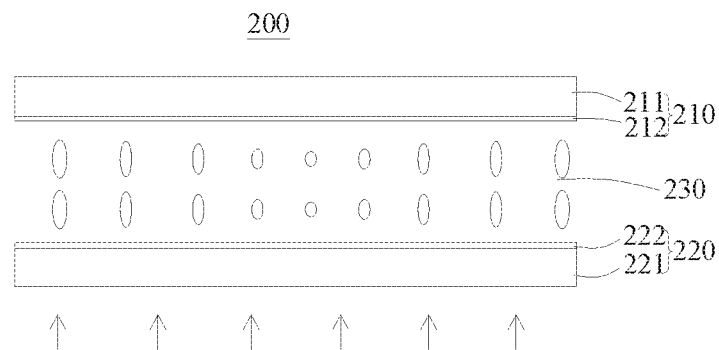
Figure 9B:
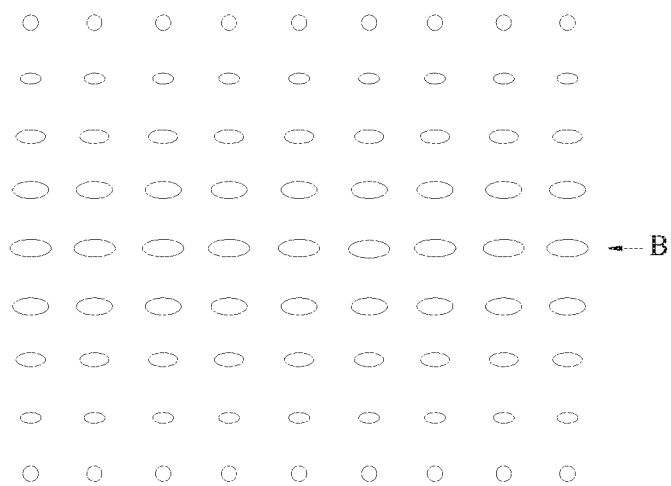

At the same time, the controller applies a control signal to the first transparent electrode layer and the second transparent electrode of the auxiliary liquid crystal panel 200. As shown in FIG. 9a, the controller applies a control signal to the second transparent electrode and the first transparent electrode layer of the auxiliary liquid crystal panel 200, to cause an electric field to be formed between the second transparent electrode and the first transparent electrode layer. The liquid crystal molecules in the electric field are rotated as shown in FIGS. 9a and 9b. That is, the horizontal axis direction of the liquid crystal molecules in the middle is constant, and the degree of rotation gradually increases from the middle to either side, such that the refractive index of the liquid crystal material corresponding to each second transparent electrode gradually increases from either side in the width direction of the second transparent electrode to the middle of the second transparent electrode. Thus, FIGS. 9a and 9b illustrate a schematic diagram of forming an equivalent positive cylindrical lens by utilizing the auxiliary liquid crystal panel 200. It is to be noted that the width direction of the second transparent electrode of the auxiliary liquid crystal panel 200 is perpendicular to the width direction of the auxiliary liquid crystal panel 100. It is to be noted that FIG. 9a is a view from the direction of B in FIG. 9b.

The auxiliary liquid crystal panel 100 shown in FIG. 8a and the auxiliary liquid crystal panel 200 shown in FIG. 9a may form a plurality of equivalent positive cylindrical lenses with orthogonal meridian directions, and the cylindrical lens with orthogonal meridian directions may form an equivalent positive spherical lens.

Figure 10A:
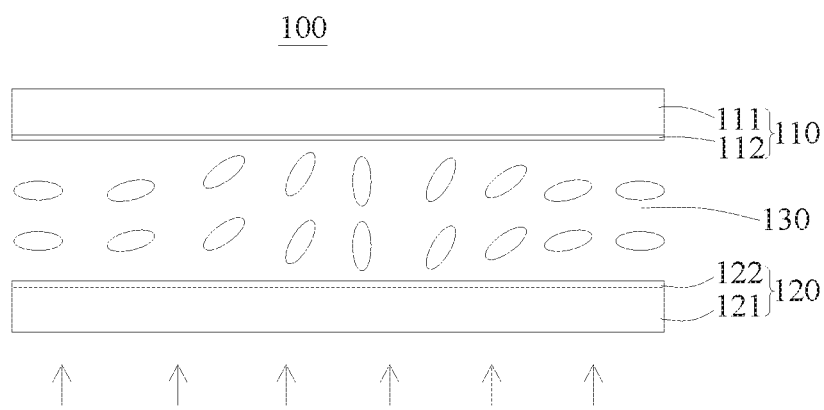
FIG. 10a is a schematic diagram of an auxiliary liquid crystal panel forming an equivalent negative lens.
Figure 10B:
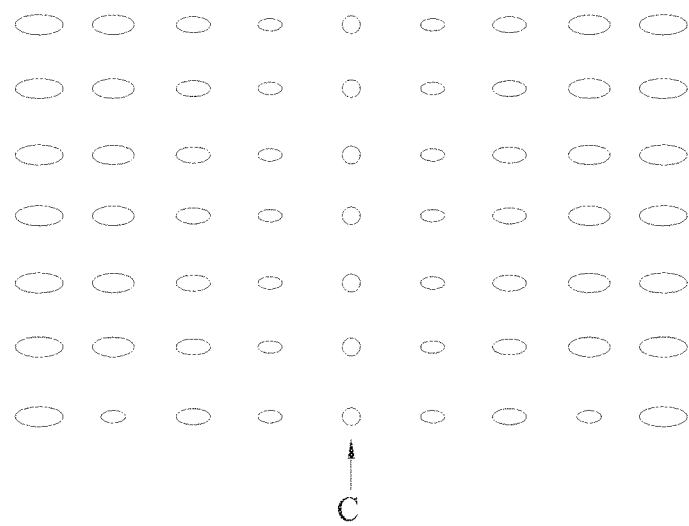

As shown in FIG. 10a, the controller applies a control signal to the second transparent electrode and the first transparent electrode layer of the auxiliary liquid crystal panel 100, to cause an electric field between the second transparent electrode and the first transparent electrode layer. The liquid crystal molecules in the electric field are rotated as shown in FIGS. 10a and 10b. That is, the horizontal axis direction of the liquid crystal molecules at either side is constant, and the degree of rotation gradually increases from either side to the middle, such that the refractive index of the liquid crystal material corresponding to each second transparent electrode gradually decreases from either side in the width direction of the second transparent electrode to the middle of the second transparent electrode. Thus, FIGS. 10a and 10b illustrate a schematic diagram of forming an equivalent negative cylindrical lens by utilizing the auxiliary liquid crystal panel 100. It is to be noted that FIG. 10a is a view from the direction of C in FIG. 10b.

Figure 11A:
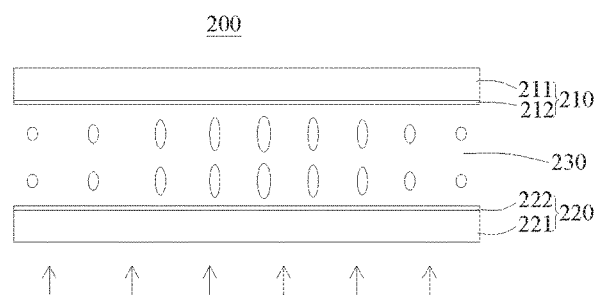
Figure 11B:
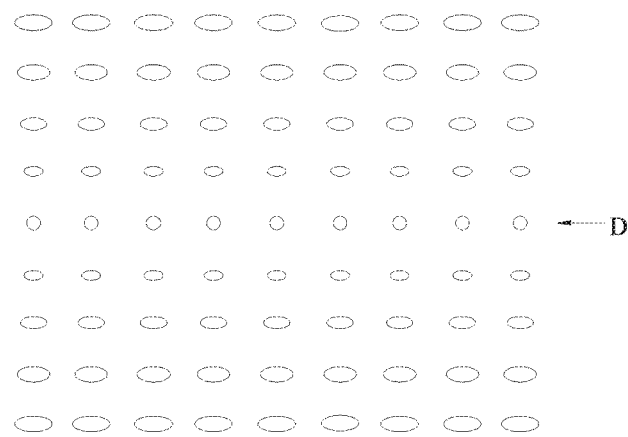

At the same time, the controller applies a control signal to the first transparent electrode layer and the second transparent electrode of the auxiliary liquid crystal panel 200. As shown in FIG. 11a, the controller applies a control signal to the second transparent electrode and the first transparent electrode layer of the auxiliary liquid crystal panel 200, to cause an electric field to be formed between the second transparent electrode and the first transparent electrode layer. The liquid crystal molecules in the electric field are rotated as shown in FIGS. 11a and 11b. That is, the horizontal axis direction of the liquid crystal molecules at either side is constant, and the degree of rotation gradually increases from either side to the middle, such that the refractive index of the liquid crystal material corresponding to each second transparent electrode gradually decreases from either side in the width direction of the second transparent electrode to the middle of the second transparent electrode. Thus, FIGS. 11a and 11b illustrate a schematic diagram of forming an equivalent negative cylindrical lens by utilizing the auxiliary liquid crystal panel 200. It is to be noted that the width direction of the second transparent electrode of the auxiliary liquid crystal panel 200 is perpendicular to the width direction of the auxiliary liquid crystal panel 100. it is to be noted that FIG. 11a is a view from the direction of D in FIG. 11b.

The auxiliary liquid crystal panel 100 shown in FIG. 10a and the auxiliary liquid crystal panel 200 shown in FIG. 11a may form a plurality of equivalent negative cylindrical lenses with orthogonal meridian directions, and the cylindrical lens with orthogonal meridian directions may form an equivalent negative spherical lens.

The equivalent spherical lens (including the equivalent positive spherical lens and the equivalent negative spherical lens) may change the exit direction of light, and is not prone to cause astigmatism, and thus may achieve good image quality. In addition, the block-shaped second transparent electrode is relatively easy to be formed, and therefore, the display device manufacturing process provided by the present disclosure is simpler and less costly.

FIGS. 12 to 20 are schematic diagrams of forming a plurality of equivalent positive spherical lenses by utilizing the auxiliary panel, various situations of which will be described below.

In the present disclosure, the display panel 300 includes a plurality of pixel units arranged in an array. Each pixel unit corresponds to a plurality of sub-pixel units. In the implementations shown in FIGS. 12 to 15 and 18 to 26 of the present disclosure, one pixel unit includes a red sub-pixel R, a green sub-pixel G, and a blue sub-pixel B.

As a preferred implementation, each pixel unit may correspond to a pair of second transparent electrodes corresponding to each other, as shown in FIGS. 12, 13, 18, 19, 21 to 23, 25 and 26. That is, each pixel unit corresponds to an equivalent spherical lens.

Figure 14:
FIG. 14 is a schematic diagram illustrating a positive lens forming an image behind the display panel, with each column of sub-pixels corresponding to one second transparent electrode, and the focal lengths of the same pixel unit being the same.
Figure 14:
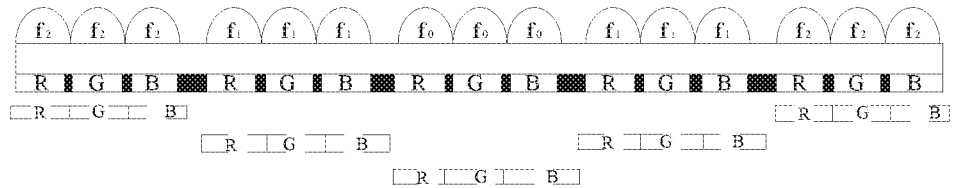
Figure 20:
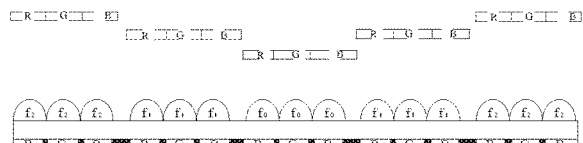
FIG. 20 is a schematic diagram illustrating a positive lens forming an image in front of the display panel, with each column of sub-pixels corresponding to one second transparent electrode, and the focal lengths of the same pixel unit being the same.

As another preferred implementation, each sub-pixel corresponds to a pair of second transparent electrodes corresponding to each other, as shown in FIGS. 14 and 20. That is, each sub-pixel corresponds to an equivalent spherical lens.

As a further preferred implementation, each sub-pixel corresponds to a plurality of pairs of second transparent electrodes corresponding to each other.

As described above, in one embodiment, the positive projection of the central point of the second transparent electrode of one of the auxiliary liquid crystal panels on the other of the auxiliary liquid crystal panels is overlapped with the central point of the corresponding second transparent electrode of the other of the auxiliary liquid crystal panels. The central axis of the equivalent spherical lens formed in the auxiliary panel passes through the center of the second transparent electrode.

In the implementation of forming an equivalent positive spherical lens, it is possible to control an image to be formed behind the display panel 300. Accordingly, the control signal provided by the controller may cause the focal length of the equivalent positive spherical lens formed in the liquid crystal layer of the auxiliary panel to be larger than the distance between the auxiliary panel and the display panel.

Figure 12:
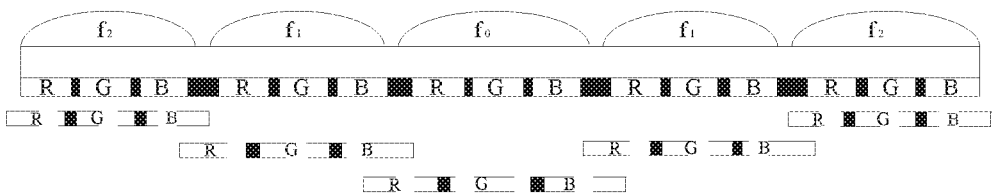
FIG. 12 is a schematic diagram illustrating a positive lens forming an image behind the display panel.
Figure 13:
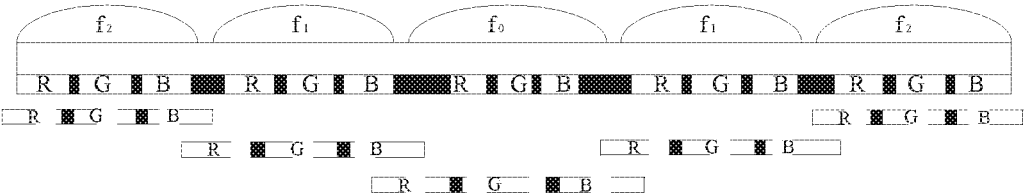
FIG. 13 is a schematic diagram illustrating a positive lens forming an image behind the display panel, with the aperture ratio of the display device gradually decreasing from the middle to either side.

As shown in FIG. 12, the object distance (the distance between the display panel and the auxiliary panel) of each of the plurality of equivalent positive spherical lenses formed by the auxiliary liquid crystal panel 100 and the auxiliary liquid crystal panel 200 is smaller than the focal length of the equivalent positive spherical lens. Therefore, an image may be formed behind the display panel. The values of the focal lengths of the plurality of equivalent positive spherical lenses corresponding to the auxiliary panel are distributed symmetrically with respect to a central line in the width direction of the display panel. In the present disclosure, f0, f1, f2 represent the focal lengths of the corresponding spherical lenses, respectively, and in the present disclosure, f0<f1<f2.

In FIG. 12, the aperture ratios of the respective pixel units are the same, and the present disclosure is not limited thereto. For example, in FIG. 13, the aperture ratio of the display panel gradually increases from the middle of the width direction of the display panel to either side in the width direction of the display panel.

It will be readily understood that if the viewer finally sees an image on the curved surface, and the middle part of the image is farthest from the display panel. Therefore, the middle part of the image is enlarged to a relatively larger degree, in order to avoid poor experience caused by the image overlapping. In one embodiment, the aperture ratio of the display panel gradually increases from the middle of the display panel to either side of the auxiliary panel. That is, from the middle of the display panel to either side of the display panel. The width of the black matrix surrounding the pixel unit gradually decreases. The black matrix may block the overlapping portions of images formed by adjacent two pixel units.

In the implementation as shown in FIG. 14, each sub-pixel corresponds to a pair of second transparent electrodes corresponding to each other. The controller is configured to be capable of providing to the first transparent electrode layer and each of the second transparent electrodes a control signal, to cause the focal lengths of the equivalent positive spherical lenses corresponding to the different sub-pixels in the same pixel unit are the same and the values of the focal lengths of the plurality of said equivalent positive spherical lenses corresponding to the auxiliary panel are distributed symmetrically with respect to the central line of the width direction of the display panel.

The light emitted from each sub-pixel is guided by an equivalent positive spherical lens. Although not shown, it will be understood by those skilled in the art that the images formed by different sub-pixels in the same pixel unit may overlap with each other. Since the overlapping of the images formed by different sub-pixels in the same pixel unit facilitates color modulation, the aperture ratio may be indirectly increased. The overlapping portion of the images formed by the two adjacent pixel units may be blocked by the black matrix between the two adjacent pixel units, and therefore, the display will not be adversely affected.

Figure 15:
FIG. 15 is a schematic diagram illustrating a positive lens forming an image behind the display panel, with each column of sub-pixels corresponding to a plurality of second transparent electrodes, and the focal lengths of the same pixel unit being different from one another.
Figure 15:
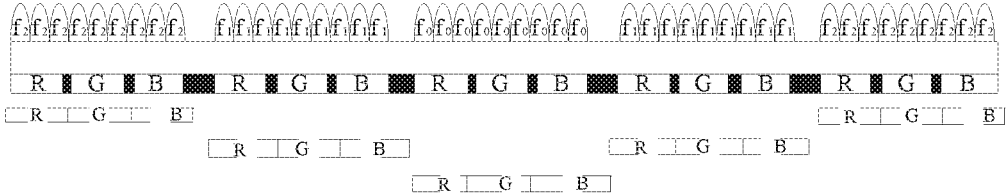

In the implementation shown in FIG. 15, each sub-pixel corresponds to a plurality of pairs of second transparent electrodes corresponding to each other, and the controller is configured to be capable of providing to the first transparent electrode layer and each of the second transparent electrodes a control signal, to cause the focal lengths of the equivalent positive spherical lenses corresponding to the different sub-pixels in the same pixel unit to be the same and the values of the focal lengths of the plurality of said equivalent positive spherical lenses corresponding to the auxiliary panel are symmetrically distributed with respect to the central line of the width direction of the display panel.

One sub-pixel corresponding to the plurality of second transparent electrodes may make different sub-pixels of one pixel unit overlap more with each other, which may better facilitate the color modulation of the display device, such that a better display effect may be obtained.

In the implementation shown in FIG. 15, each sub-pixel corresponds to three pairs of second transparent electrodes corresponding to each other. That is, each sub-pixel corresponds to three equivalent positive spherical lenses.

In the present disclosure, the diameter of each equivalent positive spherical lens may be no less than 6 μm, and the size of each sub-pixel is no less than 51 μm. Thus, each sub-pixel corresponds to at most eight equivalent spherical lenses. That is, each sub-pixel corresponds to at most 8 pairs of second transparent electrodes corresponding to each other. It should be noted that the diameter of the equivalent positive spherical lens is p as shown in FIG. 7.

As another preferred implementation of the present disclosure, an image may be formed in front of the display panel.

Specifically, the control signal provided by the controller may cause the focal length of the equivalent positive spherical lens formed in the liquid crystal layer of the auxiliary panel to be smaller than the distance between the auxiliary panel and the display panel.

Figure 18:
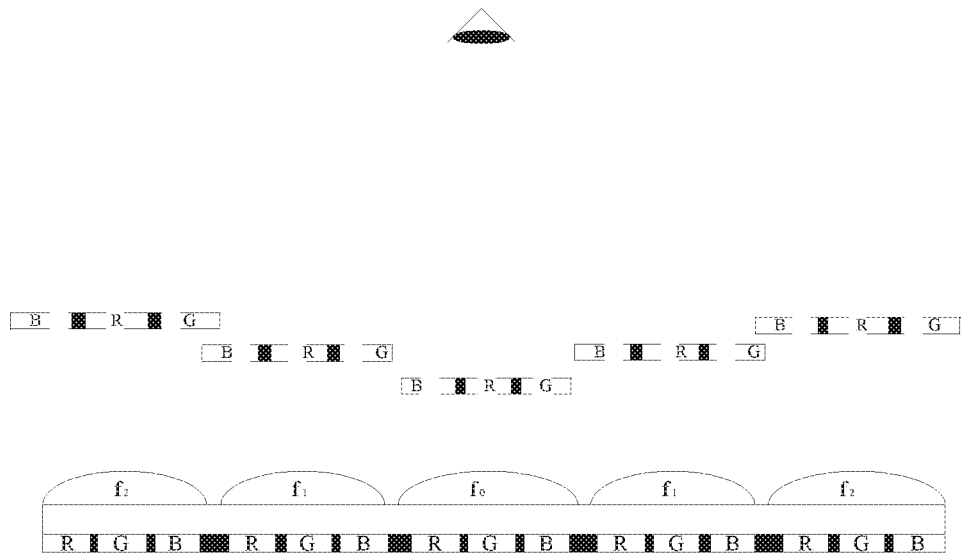
FIG. 18 is a schematic diagram illustrating a positive lens forming an image in front of the display panel.
Figure 19:
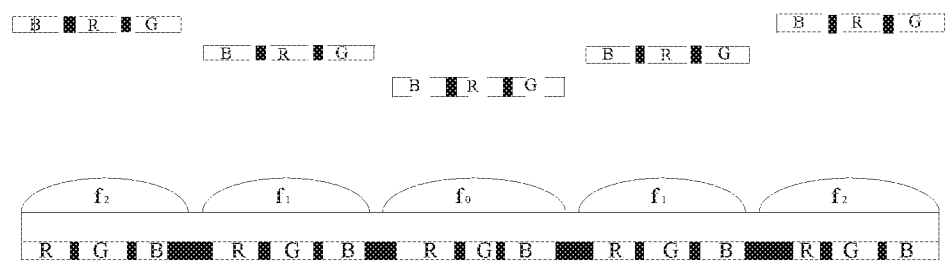
FIG. 19 is a schematic diagram illustrating a positive lens forming an image in front of the display panel, with the aperture ratio of the display device gradually decreasing from the middle to either side.

As shown in FIGS. 18 and 19, each equivalent positive spherical lens corresponds to one pixel unit. In the implementation shown in FIG. 20, each sub-pixel corresponds to one pixel unit.

It will be readily understood by those skilled in the art that although the equivalent positive spherical lens formed on the auxiliary panel in FIGS. 18 and 19 may form an inverted image in front of the display panel. That is, in the same pixel unit, the positions of the sub-pixels may change. However, it will be understood by those skilled in the art that the light emitted by the plurality of sub-pixels of the same pixel unit may be mixed with each other such that the pixel unit may display a predetermined color, and the positional change of the sub-pixels in the same pixel unit will affect the color of the pixel unit finally presented.

In the implementation shown in FIG. 18, the aperture ratios of the respective pixel units of the display panel are the same. In the implementation shown in FIG. 19, the aperture ratio of the pixel unit gradually decreases from the middle of the width direction of the display panel to either side of the width direction of the display panel. In the implementation shown in FIG. 19, it is possible to eliminate the undesirable phenomenon caused by the overlapping of the images formed by the adjacent pixel units.

In another implementation provided by the present disclosure, the final image may be formed on either side of the display panel. As an implementation of the present disclosure, as shown in FIGS. 22, 23 and 24, the auxiliary panel is divided into three portions in the width direction, and the control signal provided by the controller is capable of causing the focal lengths of the equivalent positive spherical lens corresponding to the portions of the liquid crystal layer on either side of the auxiliary panel to be smaller than the distance between the auxiliary panel and the display panel, and causing the focal lengths of the equivalent positive spherical lens corresponding to the portions of the liquid crystal layer in the middle of the auxiliary panel to be larger than the distance between the auxiliary panel and the display panel.

Figure 22:
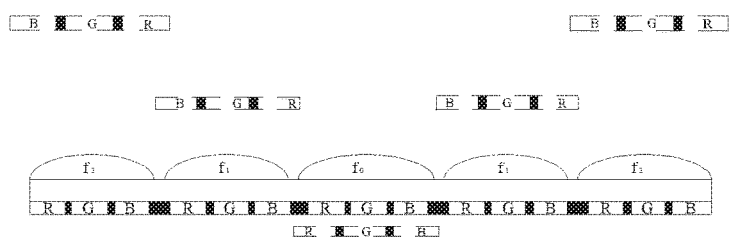
FIG. 22 is a schematic diagram illustrating a positive lens forming images on both sides of the display panel.

In the implementation shown in FIG. 22, each pixel unit corresponds to a pair of second transparent electrodes corresponding to each other, the image formed by the equivalent positive spherical lens on either side is located in front of the display panel, and the image formed by the equivalent positive spherical lens in the middle is located behind the display panel. In addition, the aperture ratios of all the pixel units are the same.

Figure 23:
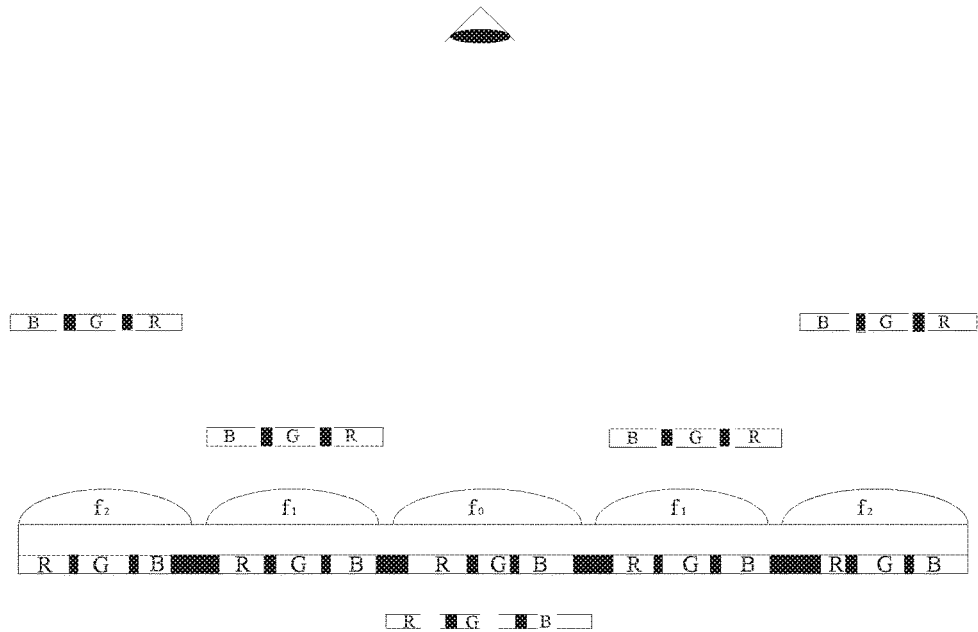
FIG. 23 is a schematic diagram illustrating a positive lens forming images on both sides of the display panel, with the aperture ratio of the display device gradually decreasing from the middle to either side.
Figure 24:
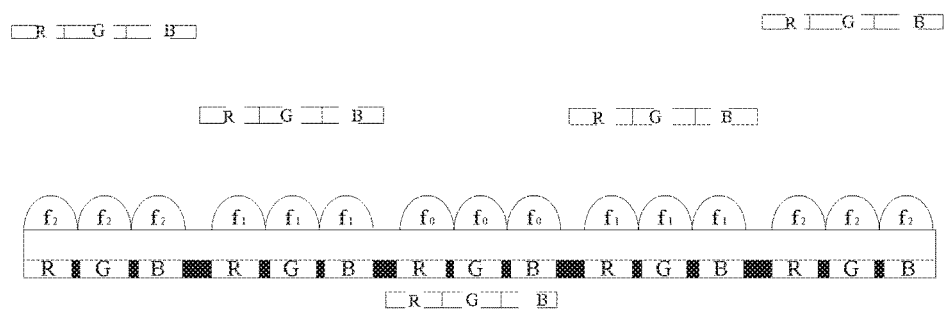
FIG. 24 is a schematic diagram illustrating a positive lens forming images on both sides of the display panel, with each column of sub-pixels corresponding to one second transparent electrode, and the focal lengths of the same pixel unit being the same.

In order to eliminate the influence of the overlapping of the image formed by the adjacent pixel units, in the implementation shown in FIG. 23, in one embodiment, for the portions of the display panel corresponding to the portions at either side of the auxiliary panel, the aperture ratio of the display panel gradually decreases from the middle of the width direction of the display panel to either side in the width direction of the display panel; and for the portions of the display panel corresponding to the portions in the middle of the auxiliary panel, the aperture ratio of the display panel gradually increases from the middle of the width direction of the display panel to either side in the width direction of the display panel.

In FIG. 22, the equivalent positive spherical lens of the portions on either side of the display panel may cause the respective pixel units to form an inverted image in front of the display panel. The equivalent positive spherical lens at the middle portion of the display panel may cause the respective pixel units to form an upright image behind the display panel.

In the implementation shown in FIG. 24, each sub-pixel corresponds to a pair of second transparent electrodes corresponding to each other, the image formed by the equivalent positive spherical lens on either side is located in front of the display panel, and the image formed by the equivalent positive spherical lens in the middle is located behind the display panel. In addition, it may be seen from FIG. 24 that the focal lengths of the equivalent positive spherical lenses corresponding to different sub-pixels in the same pixel unit are the same.

In the above, the case where the control signal is applied through the first transparent electrode layer and the second transparent electrode layer such that the liquid crystal material between the pair of second transparent electrodes corresponding to each other forms an equivalent positive spherical lens. Next, a case where a control signal is applied through the first transparent electrode layer and the second transparent electrode layer such that the liquid crystal material between the pair of second transparent electrodes corresponding to each other forms an equivalent negative spherical lens will be described.

Figure 21:
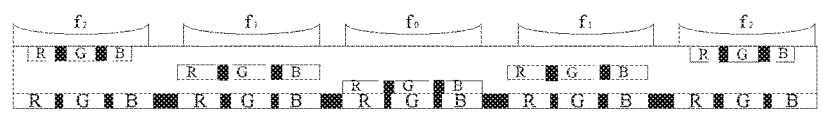
FIG. 21 is a principle diagram illustrating a negative lens forming a reduced virtual image, with the virtual curved surface between the liquid crystal lens and the pixel.

Specifically, as shown in FIG. 21, for the two auxiliary liquid crystal panels, the width direction of the second transparent electrode of one of the auxiliary liquid crystal panels 100 is consistent with the width direction of the display panel, and the controller is configured to be capable of providing a control signal to the first transparent electrode layer 112 and the second transparent electrode layer 122 of the auxiliary liquid crystal panel 100 and the second transparent electrode layer 212 and the second transparent electrode layer 222 of the auxiliary liquid crystal panel 200, respectively, to cause the refractive indices of the liquid crystal material corresponding to the respective second transparent electrodes in the auxiliary liquid crystal panel 100 and the auxiliary liquid crystal panel 200 to gradually decrease from either side in the width direction of the second transparent electrode to the middle of the second transparent electrode, to obtain an equivalent negative cylindrical lens. In the auxiliary liquid crystal panel 100 and the auxiliary liquid crystal panel 200, the equivalent negative cylindrical lenses obtained by two second transparent electrodes corresponding to each other have their meridian directions orthogonal to each other, to obtain an equivalent negative spherical lens, and the focal length of the equivalent negative spherical lens formed gradually increases from either side in the width direction of the display panel 300 to the middle in the width direction of the display panel 300.

With the implementation shown in FIG. 21, a reduced virtual image may be formed between the auxiliary panel and the display panel.

Figure 25:
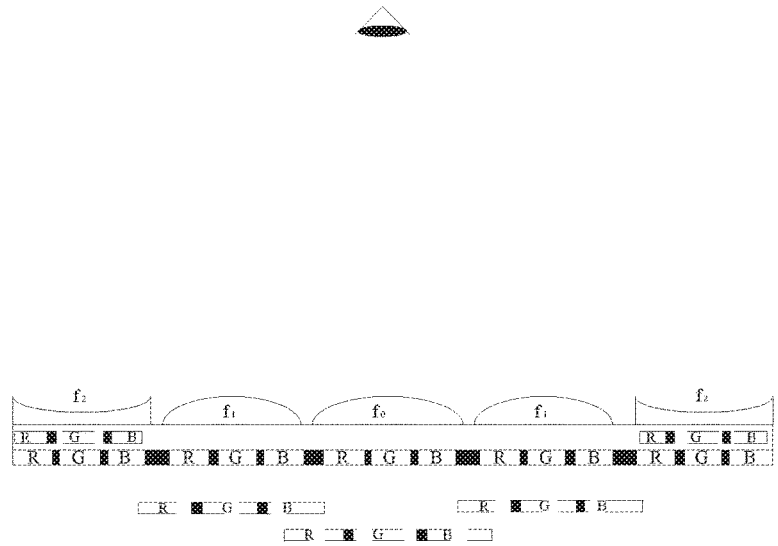
FIG. 25 is a schematic diagram illustrating imaging with a positive lens and a negative lens in combination, with the negative lens being on either side of the display panel.
Figure 26:
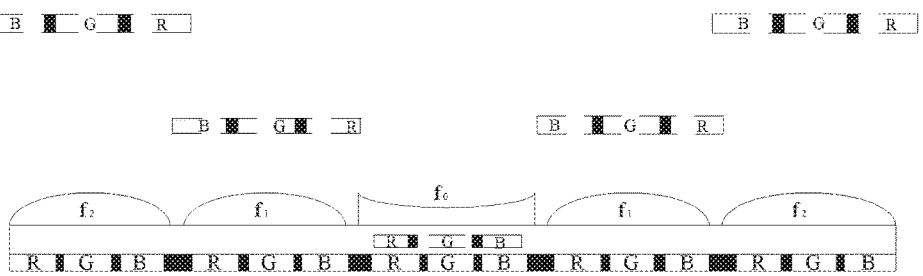
FIG. 26 is a schematic diagram illustrating imaging with a positive lens and a negative lens in combination, with the negative lens being on in the middle of the display panel.

FIGS. 25 and 26 illustrate a combination of an equivalent positive spherical lens and an equivalent negative spherical lens.

Specifically, as shown in FIG. 25, of the two auxiliary liquid crystal panels, the width direction of the second transparent electrode of one of the auxiliary liquid crystal panels is consistent with the width direction of the display panel. The auxiliary panel is divided into three portions in the width direction. The controller is configured to be capable of providing a control signal to the first transparent electrode layer and the second transparent electrodes, to cause the refractive indices of the portions in the liquid crystal layer at either side of the auxiliary panel corresponding to the respective second transparent electrodes to gradually decrease from either side in the width direction of the second transparent electrode to the middle of the second transparent electrode, to obtain an equivalent negative spherical lens, and to cause the refractive indices of the portions in the liquid crystal layer in the middle of the auxiliary panel corresponding to the respective second transparent electrodes to gradually increase from either side in the width direction of the second transparent electrode to the middle of the second transparent electrode, to obtain an equivalent positive spherical lens. The equivalent negative spherical lens at either side of the auxiliary panel forms an image between the auxiliary panel and the display panel, and the equivalent positive spherical lens in the middle of the auxiliary panel forms an image behind the display panel.

Of the two auxiliary liquid crystal panels, the width direction of the second transparent electrode of one of the auxiliary liquid crystal panels is consistent with the width direction of the display panel. As shown in FIG. 26, the auxiliary panel is divided into three portions in the width direction. The controller is configured to be capable of providing a control signal to the first transparent electrode layer and the second transparent electrodes, to cause the refractive indices of the portions in the liquid crystal layer at either side of the auxiliary panel corresponding to the respective second transparent electrodes to gradually increase from either side in the width direction of the second transparent electrode to the middle of the second transparent electrode, to obtain an equivalent positive spherical lens, and to cause the refractive indices of the portions in the liquid crystal layer in the middle of the auxiliary panel corresponding to the respective second transparent electrodes to gradually decrease from either side in the width direction of the second transparent electrode to the middle of the second transparent electrode, to obtain an equivalent negative spherical lens. The equivalent negative spherical lens in the middle of the auxiliary panel forms an image between the auxiliary panel and the display panel, and the equivalent positive spherical lens at either side of the auxiliary panel forms an image in front of the display panel. As shown in FIG. 26, the equivalent positive spherical lens of the portion located on either side of the display panel may cause the respective pixel units to form an inverted image located in front of the display panel.

In the present disclosure, the specific structure of the display panel 300 is not particularly limited. For example, the display panel 300 may be a liquid crystal display panel, which may be an organic light emitting diode display panel.

As shown in FIG. 2, when the display panel 300 is a liquid crystal display panel. The display device further includes a back light source 400. It will be readily understood that when the display panel 300 is a liquid crystal display panel, the display panel further includes a first polarizer disposed on the light entrance side of the display panel 300 and a second polarizer disposed at the light exit side of the display panel 300. It is to be noted that the polarization direction of the second polarizer is consistent with the initial arrangement direction (i.e., the direction of the major axis) of the liquid crystal molecules in the liquid crystal layer of the auxiliary liquid crystal panel 200 adjacent to the second polarizer.

Figure 27:
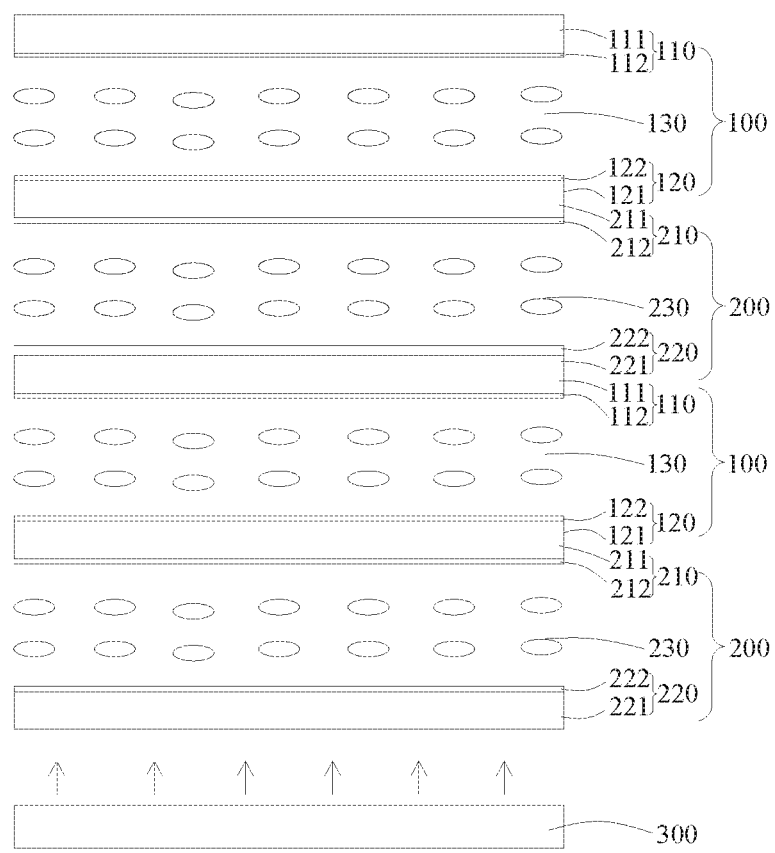
FIG. 27 is a schematic diagram illustrating a display device provided by the present disclosure, with the display panel being an organic light emitting diode display panel.

As another preferred implementation of the present disclosure, the display panel may be an organic light emitting diode display panel. As shown in FIG. 27, the display device further includes two auxiliary panels arranged in a stack. The initial arrangement directions of the liquid crystal layers of the two auxiliary panels are perpendicular to each other. The controller is capable of simultaneously proving the same control signal to the two auxiliary panels.

It will be readily understood that any natural light may be decomposed into a polarized light having a polarization direction perpendicular to the paper surface and a polarized light having a polarization direction parallel to the paper surface.

The light emitted from the display panel 300 may be decomposed into a polarized light having a polarization direction perpendicular to the paper surface and a polarized light having a polarization direction parallel to the paper surface. As may be seen from FIG. 27, the equivalent spherical lens formed by the auxiliary panel adjacent to the display panel 300 may refract the light having the polarization direction parallel to the paper surface, to form an image on the curved surface, and the light having the polarization direction perpendicular to the paper surface may directly pass through the auxiliary panel adjacent to the display panel. Subsequently, the light having the polarization direction parallel to the paper surface may pass directly through the auxiliary panel located at the outermost side (at the uppermost side in FIG. 27), and the auxiliary panel located at the outermost side may refract the light having the polarization direction perpendicular to the paper surface, to form an image on the curved surface. Eventually, the viewer may see the image on the curved surface.

In one embodiment, as shown in FIG. 27, the second base substrate 221 of the auxiliary liquid crystal panel 200 of the upper auxiliary panel is preferably the same transparent base substrate as the first base substrate of the auxiliary liquid crystal panel 100 of the lower auxiliary panel, such that the thickness of the display device may be reduced.

It is to be understood that the above embodiments are merely illustrative embodiments for the purpose of illustrating the principles of the present disclosure. However, the present disclosure is not limited thereto. It will be apparent to those skilled in the art that various modifications and alterations may be made therein without departing from the spirit and essence of the present disclosure, which are also to be regarded as falling in the scope of the present disclosure.

What is claimed is:

1. A display device comprising a display panel, wherein the display panel further comprises an auxiliary panel and a controller, the auxiliary panel comprising:

two auxiliary liquid crystal panels provided in a stack, wherein each of the auxiliary liquid crystal panels comprises a liquid crystal layer, a first substrate and a second substrate provided opposite to each other to form a cell, the liquid crystal layer is encapsulated between the first substrate and the second substrate, the first substrate comprises a first base substrate and a first transparent electrode layer disposed on the first base substrate, the second substrate comprises a second base substrate and a second transparent electrode layer disposed on the second base substrate, the second transparent electrode layer comprises a plurality of second transparent electrodes arranged in a matrix, a number of the second transparent electrodes on one of the auxiliary liquid crystal panels is equal to a number of the second transparent electrodes on the other of the auxiliary liquid crystal panels, the second transparent electrodes on one of the auxiliary liquid crystal panels are corresponded with the second transparent electrodes on the other of the auxiliary liquid crystal panels in positions, a second transparent electrode on one of the auxiliary liquid crystal panels has the same shape as a corresponding second transparent electrode on the other of the auxiliary liquid crystal panels, and is rotated by 90° with respect to the corresponding second transparent electrode on the other of the auxiliary liquid crystal panels, and initial arrangement directions of the liquid crystal layers in the two auxiliary liquid crystal panels are the same, wherein the auxiliary panel is provided at the light exit side of the display panel, and wherein the controller is configured to provide a control signal to the first transparent electrode layer and the second transparent electrode layer of the two auxiliary liquid crystal panels, respectively, such that light transmitted by the display panel forms an image on a curved surface and an opening of the curved surface faces light exit direction of the display device.

2. The display device of claim 1, wherein when the controller does not supply a control signal to the first transparent electrode layer and the second transparent electrode layer of each of the two auxiliary liquid crystal panels, refractive indices of all portions of each of the two auxiliary liquid crystal panels are the same.

3. The display device of claim 2, wherein of the two auxiliary liquid crystal panels, the width direction of the second transparent electrode of one of the auxiliary liquid crystal panels is consistent with the width direction of the display panel, the auxiliary panel is divided into three portions in the width direction, and the controller is configured to provide a control signal to the first transparent electrode layer and the second transparent electrodes, to cause the refractive indices of the portions in the liquid crystal layer at either side of the auxiliary panel corresponding to the respective second transparent electrodes to gradually increase from either side in the width direction of the second transparent electrode to the middle of the second transparent electrode, and to cause the refractive indices of the portions in the liquid crystal layer in the middle of the auxiliary panel corresponding to the respective second transparent electrodes to gradually decrease from either side in the width direction of the second transparent electrode to the middle of the second transparent electrode.

4. The display device of claim 1, wherein the display panel comprises a plurality of pixel units arranged in an array,
each pixel unit comprises a plurality of sub-pixel units,
of the two auxiliary liquid crystal panels, a width direction of the second transparent electrode of one of the auxiliary liquid crystal panels is coincident with a width direction of the display panel, and a width direction of the second transparent electrode of the other of the auxiliary liquid crystal panels is perpendicular to the width direction of the display panel,
the controller is configured to provide a control signal to the first transparent electrode layer and the second transparent electrode layer of each of the auxiliary liquid crystal panels, to cause the refractive indices of the liquid crystal material corresponding to the second transparent electrodes in the auxiliary liquid crystal panels gradually increase from either side in the width direction of the second transparent electrode to the middle of the second transparent electrode, such that in the two auxiliary liquid crystal panels, the equivalent positive cylindrical lenses obtained by a pair of second transparent electrodes corresponding to each other have their meridian directions orthogonal to each other, to obtain an equivalent positive spherical lens and the focal length of the formed equivalent positive spherical lens gradually decreases from either side of the width direction of the display panel to the middle of the width direction of the display panel.

5. The display device of claim 4, wherein the controller is configured to provide a control signal to cause the focal length of the equivalent positive spherical lens formed in the liquid crystal layer of the auxiliary panel to be larger than a distance between the auxiliary panel and the display panel.

6. The display device of claim 5, wherein each of the pixel units corresponds to a pair of second transparent electrodes corresponding to each other, and an aperture ratio of the display panel gradually increases from the middle of the width direction of the display panel to either side of the width direction of the display panel.

7. The display device of claim 4, wherein the controller is configured to provide a control signal to cause the focal length of the equivalent positive spherical lens formed in the liquid crystal layer of the auxiliary panel to be smaller than a distance between the auxiliary panel and the display panel.

8. The display device of claim 7, wherein each of the pixel units corresponds to a pair of second transparent electrodes corresponding to each other, and an aperture ratio of the display panel gradually decreases from the middle of the width direction of the display panel to either side of the width direction of the display panel.

9. The display device of claim 4, wherein each of the sub-pixels corresponds to a pair of second transparent electrodes corresponding to each other, and
the controller is configured to provide a control signal to the first transparent electrode layer and each of the second transparent electrodes, to cause the focal lengths of the equivalent positive spherical lenses corresponding to the different sub-pixels in the same pixel unit are the same and values of the focal lengths of the plurality of said equivalent positive spherical lenses corresponding to the auxiliary panel are distributed symmetrically with respect to a central line of the width direction of the display panel.

10. The display device of claim 4, wherein the auxiliary panel is divided into three portions in the width direction, and
the control signal provided by the controller is to cause the focal lengths of the equivalent positive spherical lens corresponding to the portions of the liquid crystal layer on either side of the auxiliary panel to be smaller than the distance between the auxiliary panel and the display panel, and cause the focal lengths of the equivalent positive spherical lens corresponding to the portions of the liquid crystal layer in the middle of the auxiliary panel to be larger than the distance between the auxiliary panel and the display panel.

11. The display device of claim 10, wherein for the portions of the display panel corresponding to the portions at either side of the auxiliary panel, the aperture ratio of the display panel gradually decreases from the middle of the width direction of the display panel to either side in the width direction of the display panel; and for the portions of the display panel corresponding to the portions in the middle of the auxiliary panel, the aperture ratio of the display panel gradually increases from the middle of the width direction of the display panel to either side in the width direction of the display panel.

12. The display device of claim 10, wherein each of the sub-pixels corresponds to a pair of second transparent electrodes corresponding to each other, and the focal lengths of the equivalent positive spherical lenses corresponding to different sub-pixels in the same pixel unit are the same.

13. The display device of claim 1, wherein of the two auxiliary liquid crystal panels, the width direction of the second transparent electrode of one of the auxiliary liquid crystal panels is consistent with the width direction of the display panel, and
the controller is configured to provide a control signal to the first transparent electrode layer and the second transparent electrode layer of the each of the auxiliary liquid crystal panels, to cause the refractive indices of the liquid crystal material corresponding to the respective second transparent electrodes in each of the auxiliary liquid crystal panels to gradually decrease from either side in the width direction of the second transparent electrode to the middle of the second transparent electrode, and in the auxiliary liquid crystal panels, the equivalent negative lenses obtained by two second transparent electrodes corresponding to each other have their meridian directions orthogonal to each other, to obtain an equivalent negative spherical lens, and the focal length of the equivalent negative spherical lens formed gradually increases from either side in the width direction of the display panel to the middle in the width direction of the display panel.

14. The display device of claim 1, wherein of the two auxiliary liquid crystal panels, the width direction of the second transparent electrode of one of the auxiliary liquid crystal panels is consistent with the width direction of the display panel,
the auxiliary panel is divided into three portions in the width direction, and
the controller is configured to provide a control signal to the first transparent electrode layer and the second transparent electrodes, to cause the refractive indices of the portions in the liquid crystal layer at either side of the auxiliary panel corresponding to the respective second transparent electrodes to gradually decrease from either side in the width direction of the second transparent electrode to the middle of the second transparent electrode, and to cause the refractive indices of the portions in the liquid crystal layer in the middle of the auxiliary panel corresponding to the respective second transparent electrodes to gradually increase from either side in the width direction of the second transparent electrode to the middle of the second transparent electrode.

15. The display device of claim 1, wherein the display panel is a liquid crystal display panel, and
the display panel further comprises a first polarizer disposed on the light entrance side of the display panel and a second polarizer disposed on the light exit side of the display panel.

16. The display device of claim 1, wherein the display panel is an organic light emitting diode display panel,
the display device further comprises two auxiliary panels arranged in a stack,
initial arrangement directions of the liquid crystal layers of the two auxiliary panels are perpendicular to each other, and
the controller is configured to simultaneously prove the same control signal to the two auxiliary panels.

17. The display device of claim 1, wherein the first transparent electrode layer of each of the auxiliary panels comprises a planar electrode covering the first base substrate, the second transparent electrodes of each of the auxiliary liquid crystal panels are block electrodes, and the second transparent electrode layer of each of the auxiliary liquid crystal panels is an array comprising a plurality of the second transparent electrodes.

18. The display device of claim 1, wherein a positive projection of a central point of the second transparent electrode of one of the auxiliary liquid crystal panels on the other of the auxiliary liquid crystal panels is overlapped with a central point of the corresponding second transparent electrode of the other of the auxiliary liquid crystal panels.

19. The display device of claim 1, wherein the second base substrate of one of the auxiliary liquid crystal panels is a same transparent base substrate as the first base substrate of the other of the auxiliary liquid crystal panels.

* * * * *